United States Patent
Ou et al.

(10) Patent No.: US 11,380,834 B2
(45) Date of Patent: Jul. 5, 2022

(54) METHOD RELATED TO TUNING THE PERFORMANCE OF SUPERCONDUCTING NANOWIRE SINGLE PHOTON DETECTOR VIA ION IMPLANTATION

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Xin Ou, Shanghai (CN); Lixing You, Shanghai (CN); Qi Jia, Shanghai (CN); Weijun Zhang, Shanghai (CN)

(73) Assignee: SHANGHAI INSTITUTE OF MICROSYSTEMS AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 0 days.

(21) Appl. No.: 16/761,803

(22) PCT Filed: Apr. 10, 2018

(86) PCT No.: PCT/CN2018/082551
§ 371 (c)(1),
(2) Date: May 6, 2020

(87) PCT Pub. No.: WO2019/091045
PCT Pub. Date: May 16, 2019

(65) Prior Publication Data
US 2021/0184095 A1    Jun. 17, 2021

(30) Foreign Application Priority Data
Nov. 10, 2017   (CN) .......................... 201711101757.X (51) Int. Cl.
*H01L 39/08* (2006.01)
*H01L 39/10* (2006.01)
(Continued)

(52) U.S. Cl.
CPC .............. *H01L 39/10* (2013.01); *H01L 39/08* (2013.01); *H01L 39/125* (2013.01); *H01L 39/249* (2013.01)

(58) Field of Classification Search
CPC ....... H01L 39/10; H01L 39/08; H01L 39/125; H01L 39/249; H01L 39/2416;
(Continued)

(56) References Cited

U.S. PATENT DOCUMENTS

| 9,741,919 | B2 * | 8/2017 | Chen ................... H01L 29/0676 |
| 9,954,158 | B2 * | 4/2018 | You ....................... G01J 1/0488 |
| 2013/0150245 | A1 | 6/2013 | Smith |

FOREIGN PATENT DOCUMENTS

| CN | 103579405 A |   | 2/2014 |
| CN | 103779443 A | * | 5/2014 |

(Continued)

*Primary Examiner* — Jarrett J Stark (57) ABSTRACT

The present disclosure provides a method for making a single photon detector with a modified superconducting nanowire. The method includes: preparing a substrate; modifying a superconducting nanowire with stress on a surface of the substrate; and fabricating a superconducting nanowire single photon detector based on the superconducting nanowire with stress. Based on the above technical solution, in the superconducting nanowire single photon detector provided by the present disclosure, the device material layer film has a certain thickness, the critical temperature of the device material can be reduced, the uniformity of the device material and small superconducting transition width are ensured, thereby improving the detection efficiency of the device.

10 Claims, 4 Drawing Sheets

(51) Int. Cl.
*H01L 39/12* (2006.01)
*H01L 39/24* (2006.01)

(58) Field of Classification Search
CPC ..... H01L 31/09; G01J 2001/442; G01J 11/00; B82Y 30/00; B82Y 40/00
See application file for complete search history.

(56) References Cited

FOREIGN PATENT DOCUMENTS

| | | | | |
|---|---|---|---|---|
| CN | 104091883 A | 10/2014 | | |
| CN | 105355774 A | 2/2016 | | |
| CN | 107910400 A | * | 4/2018 | .............. G01J 11/00 |

* cited by examiner

METHOD RELATED TO TUNING THE PERFORMANCE OF SUPERCONDUCTING NANOWIRE SINGLE PHOTON DETECTOR VIA ION IMPLANTATION

CROSS REFERENCE TO RELATED APPLICATION

This is a Sect. 371 National Stage of PCT International Application No. PCT/CN2018/082551, filed on 10 Apr. 2018, which claims priority of a Chinese Patent Application No. 201711101757X filed on 10 Nov. 2017, the contents of both applications hereby being incorporated by reference in their entireties for all purposes.

BACKGROUND

Field of Disclosure

The present disclosure relates to the technical field of optical detectors, in particular, to a single photon detector with a modified superconducting nanowire and a method for making the same.

Description of Related Arts

Superconducting Nanowire Single Photon Detector (SNSPD) is a highly sensitive photon detector using superconducting nanowires for photon detection. Compared with traditional semiconductor photon detectors, the SNSPDs have high detection efficiency, low dark count rate and high timing resolution. At present, SNSPDs have been widely used in the applications of quantum information, single-photon source characterization, integrated circuit defect detection, high-speed optical communication and molecular fluorescence detection.

The current SNSPDs are mainly fabricated with 3-6 nm high-quality niobium nitride (NbN) thin film. A typical width of the nanowire is about 100 nm. The SNSPDs generally operate at a temperature of 1.4-4.2K, and are biased at a current slightly below the critical current. A single photon has high enough energy to break up hundreds of Cooper pairs in the superconducting nanowire to form hot spots. These hot spots will result in transient resistance states causing the current to drop, creating a voltage pulse across a load resistor. The detection of incident photons is realized by the reading out of this voltage pulse, with a photon counter.

In practical applications, the most important performance metrics of the single photon detector is the detection efficiency $\eta$ (the probability that an incident photon results in an electrical output pulse). In reality, $\eta$ is less than 100%, and is closely related to the wavelength of the incident photon. In the actual photon counting measurements, due to absorption, reflection or transmission in the experimental environment, the photon will be lost before reaching the detector. This probability that an incident photon is finally received by a detector is defined as the optical coupling efficiency ($\eta_{coupling}$). The material, geometric structure, and optical cavity structure of the detector determine the optical absorption efficiency ($\eta_{absorption}$) the detector. Finally, when the photons are absorbed by the detector, there is an intrinsic detection efficiency ($\eta_{registering}$) is the probability that an SNSPD generates a response pulse after a photon is absorbed. Considering the above factors, the detection efficiency ($\eta_{side}$) of the entire system can be expressed as:

$$\eta_{side} = \eta_{coupling} \times \eta_{absorption} \times \eta_{registering}$$

At present, many studies are devoted to improving the detection efficiency of SNSPD. For example, the nanowire is made into a meander wire structure to enhance the optical coupling efficiency. The meander SNSPD is implanted into an optical cavity structure to improve the optical absorption efficiency, or the width of the nanowire is reduced to increase the intrinsic detection efficiency. However, these studies are all optimizing the SNSPD geometry structure, and there are few reports on the methods that can directly modify the superconducting properties of the material to improve the intrinsic detection efficiency.

For current SNSPD devices, critical temperature ($T_c$) of the nanowire is thickness dependent. $T_c$ drops fast when the thickness is less than 10 nm. It is believed that, low $T_c$ nanowire or its thin film can help to improve the intrinsic detection efficiency to a certain extent, due to a larger hotspot generation in the nanowire. However, the method to modify the nanowire's properties by reducing the film thickness will result in a decrease in the optical absorption of the nanowires, as well as a significant reduction in the Tc. The excessive reduction of $T_c$ will greatly limit the operating temperature range of the SNSPD devices.

Therefore, it is necessary to provide a method for making a superconducting nanowire single photon detector to improve the intrinsic detection efficiency without sacrificing the optical absorption. Such a method should maintain the optical absorption, and the uniformity of the superconducting thin film. It is believed that, a high uniform superconducting thin film usually demonstrates a small superconducting transition temperature width. As the $T_c$ of the material is adjusted properly, the detection performance of the device would be improved, with a limited effect on the operating temperature.

SUMMARY

The present disclosure provides a single photon detector with a modified superconducting nanowire and a method for making the same, to solve the problem that reducing the $T_c$ of the material will cause the light absorption and material uniformity of the device to deteriorate, and the superconducting transition temperature width to become widened.

The present disclosure provides a method for making a single photon detector with a modified superconducting nanowire. The method includes: preparing a substrate; modifying a superconducting nanowire with stress on a surface of the substrate; fabricating a superconducting nanowire single photon detector based on the superconducting nanowire with stress.

As a preferred solution of the present disclosure, during the preparation of the superconducting nanowire with stress on the surface of the substrate, the stress is introduced into the superconducting nanowire based on ion implantation.

As a preferred solution of the present disclosure, the preparing of the superconducting nanowire with stress on the surface of the substrate includes: preparing a superconducting thin film layer on the surface of the substrate; implanting ions from a surface of the superconducting thin film layer to introduce stress into the superconducting thin film layer; performing photolithography and reactive ion etching on the obtained superconducting thin film layer to obtain the superconducting nanowire structure with stress.

As a preferred solution of the present disclosure, the preparing of the superconducting nanowire with stress on the surface of the substrate includes: preparing a superconducting thin film layer on the surface of the substrate; performing photolithography and reactive ion etching on the superconducting thin film layer to obtain a superconducting nanowire structure; implanting ions on a surface of the superconducting nanowire structure to introduce stress into the superconducting nanowire structure, to obtain the superconducting nanowire with stress.

As a preferred solution of the present disclosure, the ions in the ion implantation process are inert gas ions.

As a preferred solution of the present disclosure, in the ion implantation process, an implantation dose ranges from $1\times10^{14}$ to $1\times10^{16}$ cm$^{-2}$, an implantation energy ranges from 10 to 100 keV, and an implantation temperature ranges from 0 to 600° C.

As a preferred solution of the present disclosure, an ion implantation area in the ion implantation process covers a surface of a stress layer to be introduced and/or ions in the ion implantation process penetrate into the stress layer to be introduced.

As a preferred solution of the present disclosure, a material of the superconducting nanowire is NbN, Nb, TaN, TiN, NbTiN or WSi.

As a preferred solution of the present disclosure, between the preparing of the substrate and the preparing of the superconducting nanowire with stress on the surface of the substrate, the method further includes: preparing an optical reflective film on the surface of the substrate, the optical reflective film is prepared between the substrate and the superconducting nanowire.

The present disclosure further provides a superconducting nanowire single photon detector, which includes: a substrate; and a superconducting nanowire located on a surface of the substrate, wherein the superconducting nanowire contains stress.

As a preferred solution of the present disclosure, the superconducting nanowire single photon detector further includes an optical reflective film located between the substrate and the superconducting nanowire.

As a preferred solution of the present disclosure, the optical reflective film includes alternately stacked SiO$_2$ thin film layers and Si thin film layers, alternately stacked SiO$_2$ thin film layers and TiO$_2$ thin film layers, or alternately stacked SiO$_2$ thin film layers and Ta$_2$O$_5$ thin film layers.

As a preferred solution of the present disclosure, a material of the superconducting nanowire is NbN, Nb, TaN, TiN, NbTiN or WSi.

As a preferred solution of the present disclosure, the superconducting nanowire includes a plurality of linear portions arranged in parallel and spaced apart, and a connecting portion connecting the plurality of linear portions sequentially end to end.

As described above, the single photon detector with a modified superconducting nanowire and the method for making the same have the following beneficial effects:

1) In the single photon detector with the modified superconducting nanowire provided by the present disclosure, while the thickness of the device material layer film is guaranteed, the $T_c$ of the device material is reduced, while the uniformity of the device material and small superconducting transition width are well preserved.

2) The single photon detector with the modified superconducting nanowire provided by the present disclosure can reduce the $T_c$ of the device material, thereby improving the intrinsic detection efficiency of the device.

BRIEF DESCRIPTION OF THE DRAWINGS

FIGS. 2 to 6 show schematic views of various structures in the process of making the single photon detector with the modified superconducting nanowire according to the present disclosure.

DESCRIPTION OF COMPONENT MARK NUMBERS

11 Substrate
12 Superconducting thin film layer
121, 122 Superconducting nanowire
1221 Connecting portion
1222 Linear portion
13 Optical reflective film
S1-S3 Operations

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Referring to FIGS. 1-8. It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during the actual implementation thereof may be freely changed, and the component layout configuration thereof may be more complex.

The present disclosure provides a method for preparing a single photon detector with a modified superconducting nanowire. The method includes: 1) preparing a substrate; 2) modifying a superconducting nanowire with stress on a surface of the substrate; and 3) fabricating a superconducting nanowire single photon detector based on the superconducting nanowire with stress.

The method for making the single photon detector with the modified superconducting nanowire of the present disclosure is described in detail with reference to specific drawings as follows.

Figure 1:
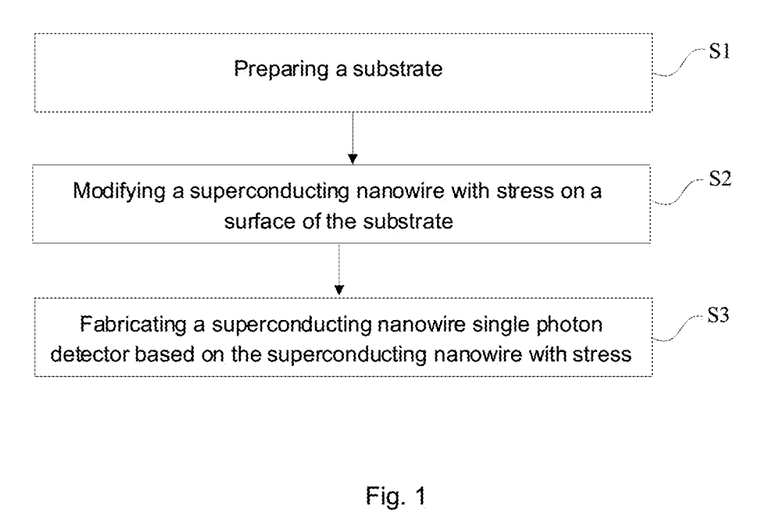
FIG. 1 shows a flow chart of a method for making a single photon detector with a modified superconducting nanowire according to the present disclosure.
Figure 2:
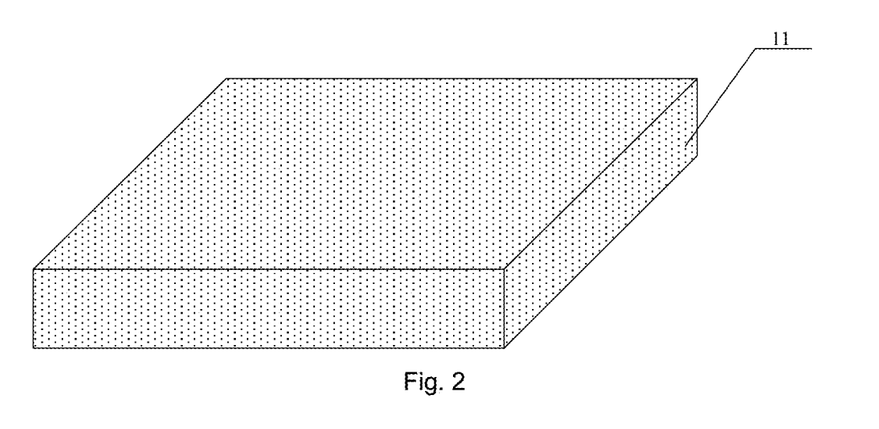
FIG. 2 shows a schematic view of a substrate prepared during making the single photon detector with the modified superconducting nanowire according to the present disclosure.

Referring to S1 in FIG. 1 and FIG. 2, operation 1) is performed to provide a substrate.

Specifically, the substrate 11 may be a common semiconductor silicon-based substrate such as a Si substrate and silicon-on-insulator (SOI), or Ge, a germanium-on-insulator substrate, or a compound semiconductor substrate such as SiGe, GaAs, GaN, InSb, and InAs. The selection of the substrate depends on the actual situation. In this embodiment, the substrate 11 is a Si substrate.

Referring to S2 in FIG. 1 and FIGS. 3 to 5, the operation 2) is performed to modify a superconducting nanowire 121 or 122 with stress on a surface of the substrate 11.

Figure 4:
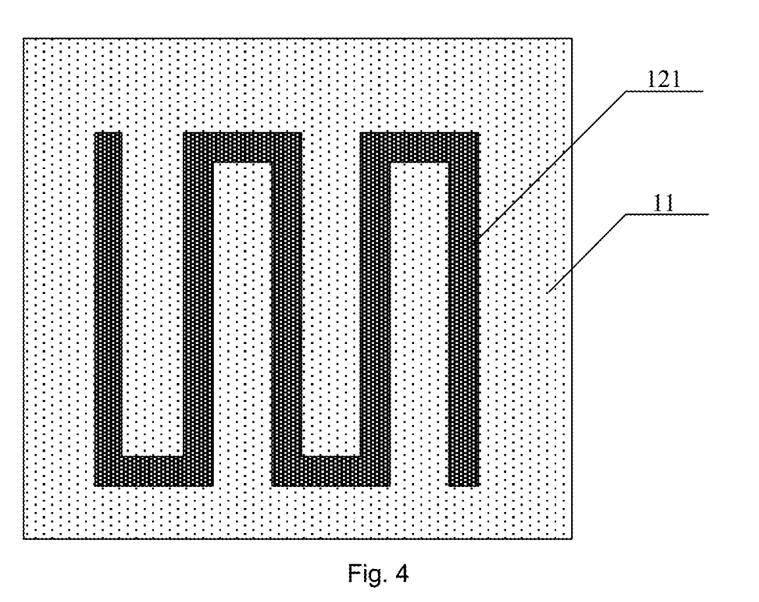
FIG. 4 shows a top view of the single photon detector with the modified superconducting nanowire according to an embodiment of the present disclosure.
Figure 5:
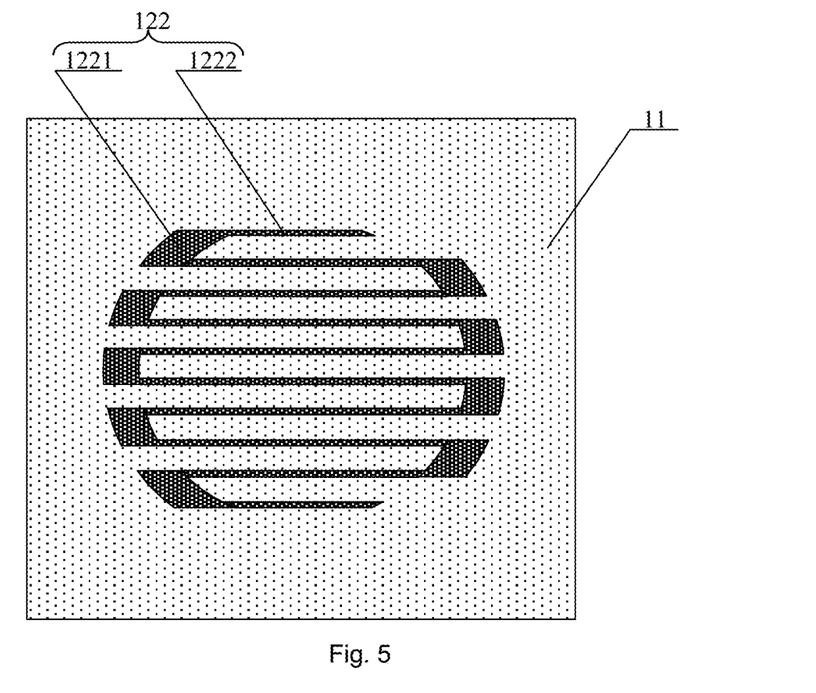
FIG. 5 shows a top view of the single photon detector with the modified superconducting nanowire according to another embodiment of the present disclosure.

It should be noted that the superconducting nanowire 121 or 122 of the present disclosure has stress. The present disclosure improves the superconducting thin film itself, thereby improving the intrinsic detection efficiency of SNSPD. The principle is introducing stress to the material by implanting ions to adjust the physical properties of the material itself, such as lattice structure and electronic structure, thereby reducing the critical temperature of the material. In addition, the implanted ions do not undergo any chemical reaction or electron exchange with the material itself, which can greatly ensure the uniformity of the material, thus improving the intrinsic detection efficiency of the device.

As an example, in operation 2), the stress is introduced into the superconducting nanowire based on ion implantation.

Figure 3:
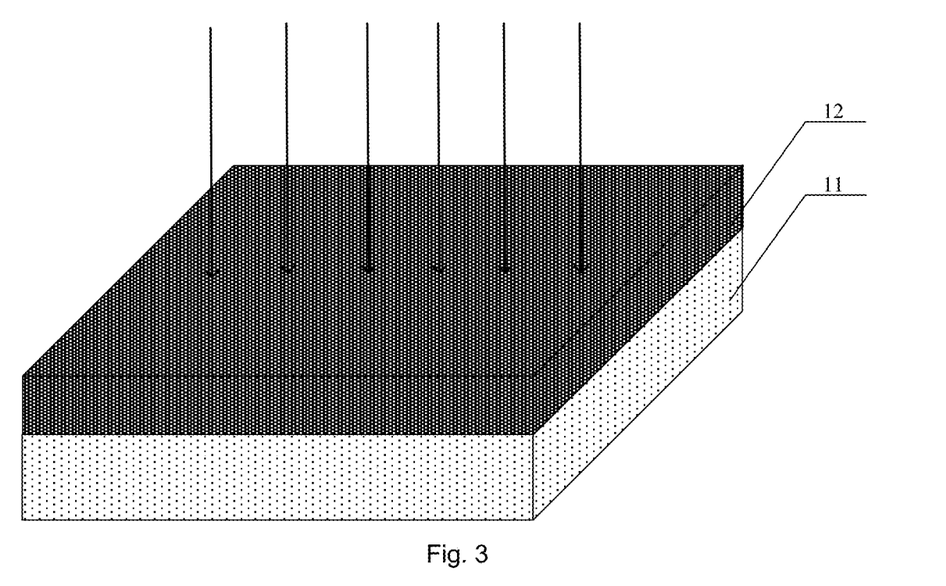
FIG. 3 shows a schematic view of preparing a superconducting thin film layer and implanting ions during making the single photon detector with the modified superconducting nanowire according to the present disclosure.

As an example, operation 2) includes the following operations: 2-1) preparing a superconducting thin film layer 12 on the surface of the substrate 11, as shown in FIG. 3; 2-2) implanting ions from a surface of the superconducting thin film layer 12 to introduce stress into the superconducting thin film layer 12, as shown in FIG. 3; and 2-3) performing photolithography and reactive ion etching process to the superconducting thin film layer obtained in the operation 2) to obtain the superconducting nanowire 121 or 122 with stress, as shown in FIGS. 4 and 5.

Specifically, this operation provides a method for making a superconducting nanowire with stress. That is, ion implantation is performed before the preparation of the SNSPD device layer (superconducting nanowire), stress is introduced, and the superconducting thin film layer 12 with stress is subjected to a photolithography and reactive ion etching process to obtain the superconducting nanowire of the desired structure. The treatment process is simple, it is convenient and quick to directly implement ion implantation, and it is beneficial to control by the ion implantation process.

As an example, the operation 2) includes the following operations: 2-1) preparing a superconducting thin film layer 12 on the surface of the substrate; 2-2) performing photolithography and reactive ion etching process to the superconducting thin film layer 12 by to obtain a superconducting nanowire structure (not shown in the figure); and 2-3) implanting ions from a surface of the superconducting nanowire structure to introduce stress into the superconducting nanowire structure, to obtain the superconducting nanowire 121 or 122 with stress.

Specifically, this operation provides another method for making a superconducting nanowire with stress. That is, ion implantation is performed after the preparation of the SNSPD device layer (superconducting nanowire), stress is introduced, and the superconducting thin film layer 12 with stress 15 is subjected to a photolithography and reactive ion etching process to obtain the superconducting nanowire of the desired structure (without stress). Then, ion implantation is performed from the surface of the superconducting nanowire structure to introduce stress. The treatment process further ensures the uniformity of the material and improves the detection efficiency.

As an example, a material of the superconducting nanowire 121 or 122 includes NbN, Nb, TaN, TiN, NbTiN or WSi.

Specifically, the material of the superconducting nanowire 121 or 122 may be any suitable material in the art, and should not be limited to the foregoing. In this embodiment, the material of the superconducting nanowire is NbN. In addition, the width of the superconducting nanowire 121 or 122 may range from 80 to 120 nm, and is 100 nm in this embodiment. The thickness may range from 2 to 15 nm, preferably 5 or 7 or 9 or 11 nm.

Specifically, the shape of the superconducting nanowire is determined according to actual needs, as shown in FIGS. 4 and 5 in the embodiment. In FIG. 4, the superconducting nanowire 121 has a meander structure, and includes a plurality of linear portions arranged in parallel and spaced apart, and a connecting portion connecting the plurality of linear portions sequentially end to end. In FIG. 5, the superconducting nanowire 122 includes a plurality of linear portions 1221 arranged in parallel and spaced apart, and a connecting portion 1222 connecting the plurality of linear portions 1221 sequentially end to end. The outer sides of the connecting portion 1222 are located on the same circumference. The distance between two adjacent linear portions may range from 50 to 500 nm, preferably 200 nm. In addition, the number of the linear portion is not specifically limited here. The number may range from 2 to 200, and is 10 in this embodiment.

As an example, the ions in the ion implantation process are inert gas ions. The inert gas ions are at least one of He ions, Ne ions, Ar ions, Kr ions, and Xe ions.

As an example, in the ion implantation process, the implantation dose ranges from $1\times10^{14}$ to $1\times10^{16}$ cm$^{-2}$, the implantation energy ranges from 10 to 100 keV, and the implantation temperature ranges from 0 to 600° C.

As an example, an ion implantation area in the ion implantation process covers a surface of a stress layer to be introduced and/or ions in the ion implantation process penetrate the stress layer to be introduced.

Specifically, the ions in the ion implantation process may be one of the inert gas ions listed above or a combination thereof, which is not specifically limited here. It can also be any other ion that can realize the function of the present disclosure. If at least two kinds of ions are implanted, the different ions may be implanted simultaneously, or sequentially. The implantation dose preferably ranges from $6\times10^{14}$ to $6\times10^{15}$cm$^{-2}$. The implantation energy preferably ranges from 20 to 80 keV. The implantation temperature preferably ranges from 20 to 400° C. In this embodiment, the implantation dose is $1\times10^{15}$cm$^{-2}$, the implantation energy is 60 keV, and the implantation temperature is 200° C.

Specifically, in this embodiment, the ions in the ion implantation process cover the surface of the stress layer to be introduced, and the ions in the ion implantation process penetrate the stress layer to be introduced. That is, if the ion implantation process is implemented before the preparation of the SNSPD device layer, the implanted ions cover the entire superconducting thin film layer 12 and penetrates the material layer. If the ion implantation process is performed after the preparation of the SNSPD device layer, the implanted ions cover the entire superconducting nanowire 121 or 122 and penetrate the layer, thereby further ensuring the uniformity of the device material.

Figure 6:
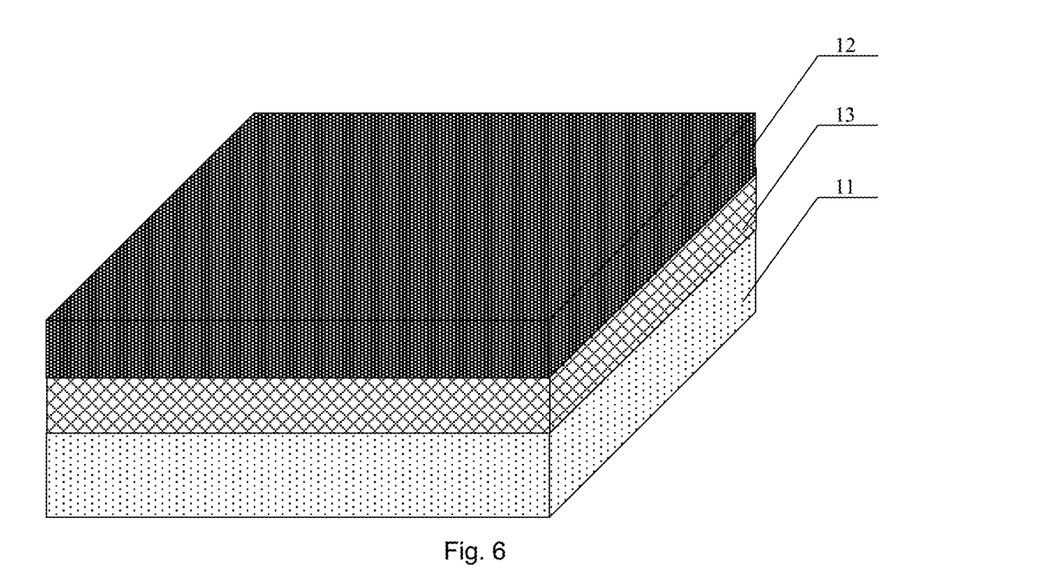
FIG. 6 shows a schematic view of preparing an optical reflective film and a superconducting thin film layer during making the single photon detector with the modified superconducting nanowire according to the present disclosure.

As an example, between the operation 1) and the operation 2), the method further includes: preparing an optical reflective film 13 on the surface of the substrate 11. The optical reflective film 13 is prepared between the substrate 11 and the superconducting nanowire 121 or 122, as shown in FIG. 6.

Specifically, in this embodiment, the optical reflective film 13 is prepared between the substrate 11 and the superconducting nanowire 121 or 122. The optical reflective film 13 can be set according to specific device structures, and is not specifically limited here.

Specifically, the optical reflective film 13 includes alternatingly stacked $SiO_2$ thin film layers and Si thin film layers, alternately stacked $SiO_2$ thin film layers and $TiO_2$ thin film layers, or alternately stacked $SiO_2$ thin film layers and $Ta_2O_5$ thin film layers. In addition, the material of the optical reflective film 13 may be Ag, Au, or Al, etc.

Referring to S3 in FIG. 1, the operation 3) is performed to fabricate a superconducting nanowire single photon detector based on the superconducting nanowire with stress.

Referring to FIGS. 4-6, the present disclosure further provides a single photon detector with a modified superconducting nanowire made by any of the above methods. The detector includes: a substrate 11; and a superconducting nanowire 121 or 122 disposed on a surface of the substrate 11, the superconducting nanowire 121 or 122 contains stress.

Specifically, the substrate 11 may be a common semiconductor silicon-based substrate such as a Si substrate and silicon-on-insulator (SOI), or Ge, a germanium-on-insulator substrate, or a compound semiconductor substrate such as SiGe, GaAs, GaN, InSb, and InAs. The selection of the substrate depends on the actual situation. In this embodiment, the substrate 11 is a Si substrate.

As an example, the superconducting nanowire single photon detector further includes an optical reflective film 13 disposed between the substrate 11 and the superconducting nanowire 121 or 122.

As an example, the optical reflective film 13 includes alternatingly stacked $SiO_2$ thin film layers and Si thin film layers, alternately stacked $SiO_2$ thin film layers and $TiO_2$ thin film layers, or alternately stacked $SiO_2$ thin film layers and $Ta_2O_5$ thin film layers.

As an example, a material of the superconducting nanowire 121 or 122 is NbN, Nb, TaN, TiN, NbTiN or WSi.

As an example, the superconducting nanowire 121 or 122 includes a plurality of linear portions arranged in parallel and spaced apart, and a connecting portion connecting the plurality of linear portions sequentially end to end.

As an example, the outer sides of the connection portion 1222 of the superconducting nanowire are located on the same circumference.

Specifically, the material of the superconducting nanowire 121 or 122 may be any suitable material in the art, and should not be limited to the foregoing. In this embodiment, the material of the superconducting nanowire is NbN. In addition, the width of the superconducting nanowire 121 or 122 may range from 80 to 120 nm, and is 100 nm in this embodiment. The thickness may range from 2 to 15 nm, preferably 5 or 7 or 9 or 11 nm.

Specifically, the geometrical structure of the superconducting nanowire is determined according to actual needs, as shown in FIGS. 4 and 5 in the embodiment. In FIG. 4, the superconducting nanowire 121 has a meander structure, and includes a plurality of linear portions arranged in parallel and spaced apart, and a connecting portion connecting the plurality of linear portions sequentially end to end. In FIG. 5, the superconducting nanowire 122 includes a plurality of linear portions 1221 arranged in parallel and spaced apart, and a connecting portion 1222 connecting the plurality of linear portions 1221 sequentially end to end. The outer sides of the connecting portion 1222 are located on the same circumference. The distance between two adjacent linear portions may range from 50 to 500 nm, preferably 200 nm. In addition, the number of the linear portion is not specifically limited here. The number may range from 2 to 200, and is 10 in this embodiment.

Figure 7:
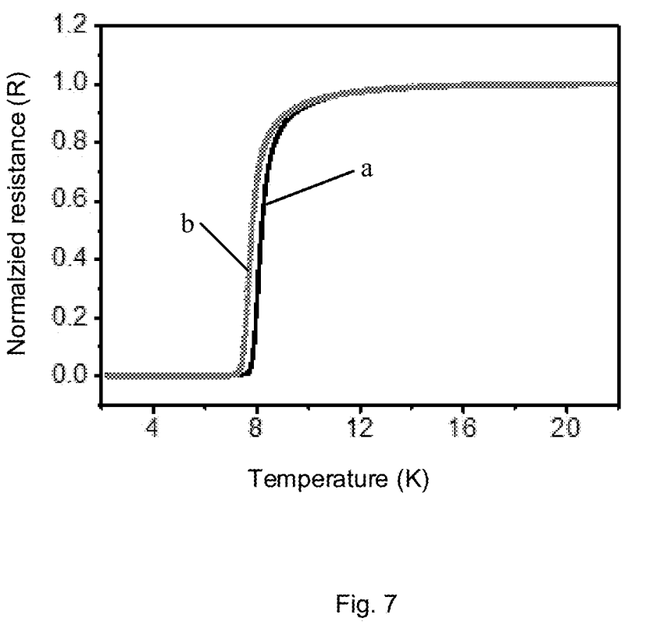
FIG. 7 shows a comparison of the normal-to-superconducting transition curves of the device material layer of the single photon detector with the modified superconducting nanowire according to the present disclosure and a superconducting nanowire single photon detector without ion implantation.
Figure 8:
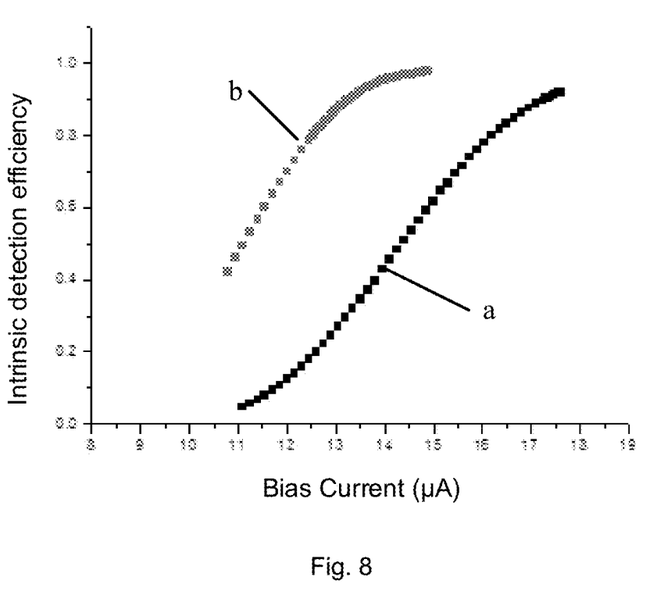
FIG. 8 shows the detection efficiency curves of the single photon detector with the modified superconducting nanowire according to the present disclosure and the superconducting nanowire single photon detector without ion implantation.

It should be further noted that the ion-implanted SNSPD device layer (i.e. the superconducting nanowire with stress) of the present disclosure has significant beneficial effects. Referring to FIGS. 7 and 8. Specifically, FIG. 7 shows a comparison of the normal-to-superconducting transition curves of the superconducting nanowire single photon detector and a superconducting nanowire single photon detector without ion implantation. "a" shows the normalized resistance (R) of the device layer without ion implantation as a function of temperature, "b" shows the R of the device layer of the present disclosure as a function of temperature. The resistance is normalized to its normal state value at a temperature of 20K, which is denoted as R(20K). It can be seen that the device layer of the present disclosure has a lower critical temperature. Here, critical temperature is defined as the temperature at which the R drops to 50% R(20K). The superconducting transition width is defined by the temperature difference between 90% and 10% points of the R(20K). It also can be found that, the superconducting transition width is almost the same in "a" and "b" curves. FIG. 8 shows the intrinsic detection efficiency variation curves of the superconducting nanowire single photon detector of the present disclosure and the superconducting nanowire single photon detector without ion implantation. "a" shows the intrinsic detection efficiency as a function of the bias current of the device without ion implantation, "b" shows the intrinsic detection efficiency as a function of the bias current of the device of the present disclosure. It can be seen that the superconducting nanowire single photon detector of the present disclosure has a higher intrinsic detection efficiency.

In summary, the present disclosure provides a method for making a single photon detector with a modified superconducting nanowire. The method includes: preparing a superconducting nanowire with stress on a surface of the substrate; fabricating a superconducting nanowire single photon detector based on the superconducting nanowire with stress. Based on the above technical solution, in the single photon detector with the modified superconducting nanowire of the present disclosure, the thickness of the device material layer film is ensured, the critical temperature $T_c$ of the device material is reduced, the uniformity of the device material and small superconducting transition width are ensured, thereby improving the detection efficiency of the device.

Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

We claim:

1. A method for making a single photon detector with a modified superconducting nanowire, comprising:
    preparing a substrate;
    modifying a superconducting nanowire with stress on a surface of the substrate, the stress is introduced into the superconducting nanowire based on ion implantation; and
    fabricating a superconducting nanowire single photon detector based on the superconducting nanowire with stress.

2. The method for making a single photon detector with a modified superconducting nanowire according to claim 1, wherein said fabricating of the superconducting nanowire with stress on the surface of the substrate includes:
    preparing a superconducting thin film layer on the surface of the substrate;
    implanting ions from a surface of the superconducting thin film layer to introduce stress into the superconducting thin film layer; and
    performing photolithography and reactive ion etching on the obtained superconducting thin film layer to form the superconducting nanowire with stress.

3. The method for making a single photon detector with a modified superconducting nanowire according to claim 1, wherein said preparing of the superconducting nanowire with stress on the surface of the substrate includes:
    preparing a superconducting thin film layer on the surface of the substrate;
    performing photolithography and reactive ion etching process on the superconducting thin film layer to obtain a superconducting nanowire structure; and
    implanting ions on a surface of the superconducting nanowire structure to introduce stress into the superconducting nanowire structure, to obtain the superconducting nanowire with stress.

4. The method for making a single photon detector with a modified superconducting nanowire according to claim 2, wherein the ions in the ion implantation process are inert gas ions.

5. The method for making a single photon detector with a modified superconducting nanowire according to claim 4, wherein in the ion implantation process, an implantation dose ranges from $1\times10^{14}$ to $1\times10^{16}$ cm-2, an implantation energy ranges from 10 to 100 keV, and an implantation temperature ranges from 0 to 600° C.

6. The method for making a single photon detector with a modified superconducting nanowire according to claim 2, wherein an ion implantation area in the ion implantation process covers a surface of a stress layer to be introduced and/or ions in the ion implantation process penetrate into the stress layer to be introduced.

7. The method for making a single photon detector with a modified superconducting nanowire according to claim 1, wherein a material of the superconducting nanowire is NbN, Nb, TaN, TiN, NbTiN or WSi.

8. The method for making a single photon detector with a modified superconducting nanowire according to claim 1, wherein between said preparing of the substrate and said preparing of the superconducting nanowire with stress on the surface of the substrate, the method further comprises:
    preparing an optical reflective film on the surface of the substrate, the optical reflective film is prepared between the substrate and the superconducting nanowire.

9. The method for making a single photon detector with a modified superconducting nanowire according to claim 3, wherein the ions in the ion implantation process are inert gas ions.

10. The method for making a single photon detector with a modified superconducting nanowire according to claim 3, wherein an ion implantation area in the ion implantation process covers a surface of a stress layer to be introduced and/or ions in the ion implantation process penetrate into the stress layer to be introduced.

* * * * *